(12) United States Patent
Bourret-Courchesne

(10) Patent No.: US 6,534,332 B2
(45) Date of Patent: Mar. 18, 2003

(54) METHOD OF GROWING GAN FILMS WITH A LOW DENSITY OF STRUCTURAL DEFECTS USING AN INTERLAYER

(75) Inventor: Edith D. Bourret-Courchesne, Richmond, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/839,656

(22) Filed: Apr. 20, 2001

(65) Prior Publication Data

US 2002/0005593 A1 Jan. 17, 2002

Related U.S. Application Data

(60) Provisional application No. 60/199,031, filed on Apr. 21, 2000.

(51) Int. Cl.$^7$ ............................................... H01L 21/00
(52) U.S. Cl. ............................. 438/47; 438/46; 438/48; 148/33.4
(58) Field of Search ....................... 438/46, 507, 967, 438/503; 257/76, 77, 183, 200

(56) References Cited

U.S. PATENT DOCUMENTS

| | | | |
|---|---|---|---|
| 5,183,776 A | 2/1993 | Lee | |
| 5,281,830 A | 1/1994 | Kotaki et al. | |
| 5,389,571 A | 2/1995 | Takeuchi et al. | |
| 5,583,879 A | 12/1996 | Yamazaki et al. | |
| 5,846,844 A | 12/1998 | Akasaki et al. | |
| 5,862,167 A | 1/1999 | Sassa et al. | |
| 5,863,811 A | 1/1999 | Kawai et al. | |
| 5,900,647 A | * 5/1999 | Inoguchi | 257/76 |
| 5,905,276 A | 5/1999 | Manabe et al. | |
| 6,030,886 A | 2/2000 | Yuri et al. | |
| 6,033,490 A | * 3/2000 | Mimura et al. | 148/33.4 |
| 6,091,083 A | 7/2000 | Hata et al. | |

OTHER PUBLICATIONS

Amano, H. Et Al., Appl. Phys. Lett., vol. 48, p. 353–355 (1986).
Marchand, H. Et Al., Appl. Phys. Lett., vol. 73, pg. 747–749 (1998).
Zheleva, T.S. Et Al., Appl. Phys. Lett, vol. 71, p. 2472–2474 (1997).
Liliental–Weber, Z. Et Al., MRS Internet J. Nitride Semicond. Res., 4S1, G4.6 (1999).
Iwaya, M. Et Al., Jpn. J. Appl. Phys. vol. 37, L316–318 (1998).
Amano, H. Et Al., MRS Internet J. Nitride Semicond. Res. 4S1, G10.1 (1999).
Lahreche, H. Et Al., Journal of Crystal Growth 205, p. 245–252 (1999).
Odedra, R. Et Al., J. Electron mater, vol. 29 No.1, p. 161–164 (2000).
Kamiyama, Et Al., Journal of Crystal Growth, 223, (2001) 83–91.

\* cited by examiner

*Primary Examiner*—David Nelms
*Assistant Examiner*—Dung Anh Le
(74) *Attorney, Agent, or Firm*—Charles R. Nold

(57) ABSTRACT

A dramatic reduction of the dislocation density in GaN was obtained by insertion of a single thin interlayer grown at an intermediate temperature (IT-IL) after the growth of an initial grown at high temperature. A description of the growth process is presented with characterization results aimed at understanding the mechanisms of reduction in dislocation density. A large percentage of the threading dislocations present in the first GaN epilayer are found to bend near the interlayer and do not propagate into the top layer which grows at higher temperature in a lateral growth mode. TEM studies show that the mechanisms of dislocation reduction are similar to those described for the epitaxial lateral overgrowth process, however a notable difference is the absence of coalescence boundaries.

10 Claims, 2 Drawing Sheets

METHOD OF GROWING GAN FILMS WITH A LOW DENSITY OF STRUCTURAL DEFECTS USING AN INTERLAYER

CROSS REFERENCE TO RELATED APPLICATIONS

This application claims priority from the following application: U.S. Application No.: 60/199,031, filed Apr. 21, 2000.

STATEMENT REGARDING FEDERALLY SPONSORED RESEARCH OR DEVELOPMENT

This invention was made with government support under Grant (Contract) No. DE-AC03-76F00098 awarded by The United States Department of Energy. The United States Government has certain rights to this invention.

BACKGROUND OF THE INVENTION

Recently, there has been enormous interest in growth of Group III nitrides, and particularly gallium nitride (GaN) thin films, Jpn. J. Appl. Phys. Vol. 34 (1995) pp. L 797–L 799. GaN, and related (Aluminum, Indium)N alloys are being utilized for the production of efficient optoelectronic devices, e.g. light emitters and detectors spanning the spectral range of visible to deep ultra-violet (UV). In addition, the direct wide bandgap and the chemical stability of Group III nitrides are very beneficial for high-temperature and high-power operated electronic devices, e.g. hetero-junction bipolar and field effect transistors.

When GaN is directly grown on a sapphire substrate, the growth mode is three-dimensional due to the large lattice mismatch, the chemical dissimilarity, and the thermal expansion difference. The layer contains structural defects such as point defects, misfit dislocations, and stacking faults. These defects degrade the film's structural, morphological, and electronic properties. In order to achieve high quality epitaxial growth, researchers have introduced a thin low-temperature grown AlN or GaN layer serving as a buffer layer. This layer provides nucleation sites for subsequent two-dimensional GaN growth at higher temperatures, see H. Amano, M. Kito, K. Hiramatsu, and I. Akasaki, Jpn. J. Appl. Phys. 28, L2112 (1989) and S. Nakamura, T. Mukai, M. Senoh, and N. Isawa, Jpn. J. Appl. Phys. 31, L139 (1992). Therefore, the control of buffer layer growth is the most important step in the improvement of GaN main layer properties. The effect of buffer layer thickness and growth temperature on GaN main layer properties has been well studied: G. S. Sudhir, Y. Peyrot, J. Krüger, Y. Kim, R. Klockenbrink, C. Kisielowski, M. D. Rubin and E. R. Weber, Mat. Res. Symp. Proc. 482, pp. 525–530 (1998); Y. Kim, R. Klockenbrink, C. Kisielowski, J. Krüger, D. Corlatan, Sudhir G. S., Y. Peyrot, Y. Cho, M. Rubin, and E. R. Weber, Mat. Res. Symp. Proc. 482, pp. 217–222 (1998); J. Krüger, Sudhir G. S., D. Corlatan, Y. Cho, Y. Kim, R. Klockenbrink, S. Rouvimov, Z. Liliental-Weber, C. Kisielowski, M. Rubin and E. R. Weber, Mat. Res. Symp. Proc. 482 pp. 447–452 (1998). Buffer layers for Group-III nitride growth has been discussed in Mohammad et al., "Progress and Prospects of Group-III Nitride Semiconductors", *Prog. Quant. Electr.* 1996, Vol. 20, No. 5/6 pp. 418–419, hereby incorporated by reference in its entirety. Various buffer materials are disclosed GaN and related alloys are of particular interest for light emitting thin films because of their ability to cover a wide spectral range. Since no crystalline substrate with a lattice parameter close enough to that of GaN is yet available, different growth techniques have been developed in order to limit the defect density. The basic process that made epitaxial growth on sapphire possible, consists of the deposition of a buffer layer at low temperature (LT-BL) before the growth of GaN at high temperature, H. Amano, N. Sawaki, L Akasaki and Y. Toyada., Appl. Phys. Lett. 48, 353 (1986). Major structural imperfections are found in the high temperature layer and the dislocation density is about $10^9$–$10^{10}$ dislocations/cm$^2$. The most sophisticated process to reduce the density of dislocations is the so-called "lateral epitaxial overgrowth" (LEO) technique, H. Marchand et al., Appl. Phys. Lett. 73, 747 (1998) and Zheleva et al., Appl. Phys. Lett. 71, 247 (1997). It gives the best results to date but it still suffers from the large number of processing steps required. In the ELO process, a dielectric mask is deposited on a first GaN layer. Lithographic techniques are used to open patterns in the mask. Then, growth of GaN is resumed, nucleation of growth occurs in the openings and, with the proper growth conditions, lateral growth above the mask allows the selected epitaxial areas to fully coalesce. Dislocations do propagate through the openings but bend over the mask where the growth is predominantly lateral. A number of devices with improved performance have been produced using the ELO technique.

The use of pendeo-epitaxy has also resulted in production of more efficient performing devices. In pendeo-epitaxy, lateral overgrowth is initiated on etched GaN. Similarly to the standard ELO technique, dislocations propagate above the seed areas but bend over due to lateral growth in the pendeo area.

Another technique, the cantilever method, makes use of a patterned substrate. GaN does not nucleate easily in the etched stripes of the pattern and lateral overgrowth occurs above these grooves. The above references are hereby incorporated by reference in their entirety. In all these LEO techniques, the lowest dislocation density is observed at the top of the GaN layers but these still show the presence of grain boundaries with mixed dislocations that are formed at the meeting front of the two overgrown layers to compensate a misorientation, Liliental-Weber, et al., MRS Internet J. Nitride Semicond. Res. 4SI, G4.6 (1999). Another approach is to grow intermediate-Low temperature (LT) layers. This method has been introduced by Iwaya et al., Iwaya, et al. Jpn. J. Appl. Phys. 37, L316 (1998), and proved to be efficient. Thus, the process is long and expensive. However, several interlayers are required in order to reach dislocation density as low as $10^8$/cm$^2$. The low temperature layers, which are either GaN or AlGaN, introduce excessive stress and after a few such layers the material cracks.

In another study by H. Lahreche et al., Journal of Crystal Growth 205 pp. 245–252 (1999), a silane was used to nucleate an intermediate layer of self-organized islands of a GaN:Si and succeeded in reducing the dislocations density to the $7 \times 10^8$/cm$^2$ range. However the presence of the strongly n-type dopant silicon might not be always suitable.

The method of the instant invention contemplates a process that reduces the density of threading dislocations by about three orders of magnitude from well above $10^{10}$/cm$^2$ down to below $4 \times 10^7$/cm$^2$, and the process essentially nearly eliminates the presence of dislocations at the coalescence boundries. This process makes use of a single intermediate temperature interlayer (IT-IL).

BRIEF SUMMARY OF THE INVENTION

This invention contemplates GaN layers grown with only one intermediate-temperature intermediate layer (IT-IL) of GaN. It is preferred that the GaN IT-IL layer be undoped. A dramatic reduction of the dislocation density in GaN was obtained by the growth of a single interlayer grown at an intermediate temperature (IT-IL) after the initial growth at high temperature. This process for growing GaN films results in a reduction in dislocation density over the known prior art. A large percentage of the threading dislocations present in the first GaN epilayer are found to bend near the interlayer and do not propagate into the top layer which grows at higher temperature in a lateral growth mode. Threading dislocations have been found to act as nonradiative centers and scattering centers in electron transport that is detrimental to the performance of light emitting diodes and field effect transistors, Ng et al, J. Electron. Mater. 27, 190 (1998). Efforts around the world are aimed at reducing the density of structural defects in GaN. TEM studies show that the mechanisms of dislocation reduction are similar to those described for the epitaxial lateral overgrowth process, however a notable difference is the absence of coalescence boundaries. The above listed references are hereby incorporated by reference in their entirety.

DETAILED DESCRIPTION OF THE PREFFERED EMBODIMENTS

Figure 1:
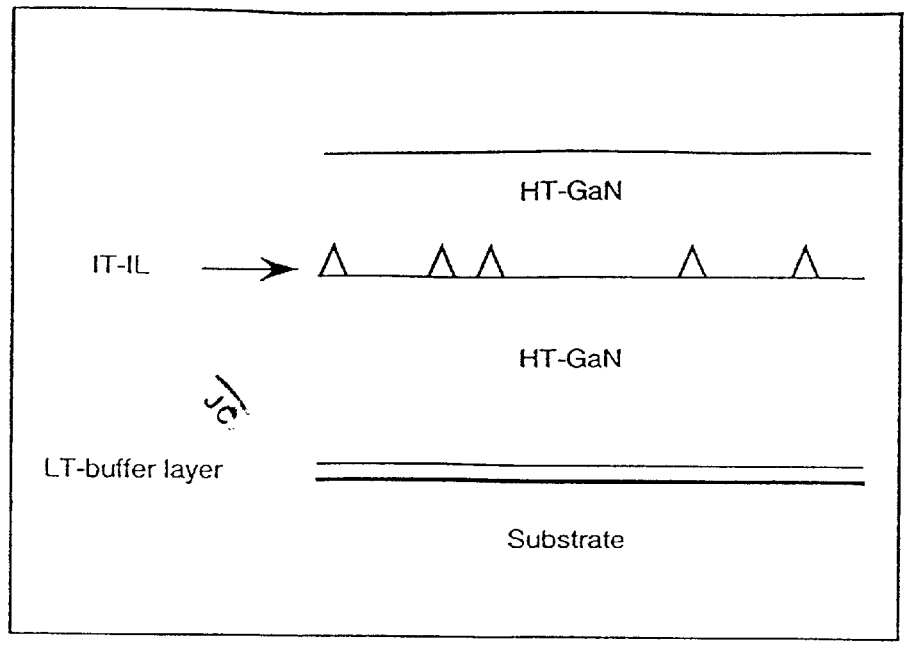
FIG. 1 is a schematic of the IT-IL process.

GaN was deposited on sapphire (c-plane) substrates by organometallic vapor phase epitaxy. This deposition process is used for illustration purposes. It is contemplated that any deposition process may be used. Pd-purified hydrogen was used as the carrier gas. Triethylgallium (TEGa) and water-free dimethylhydrazine (DMHz) supplied by Epichem Inc., were used as gallium and nitrogen precursors. The invention contemplates that trimethylgallium (TMGa) may also be used. The c-plane sapphire substrates were first cleaned in situ with pure hydrogen at 1000° C. Dimethylhydrazine was introduced at 1000° C. for nitridation of the surface. Deposition of GaN was initiated with TEGa and DMHz introduced simultaneously in the deposition chamber at 580° C. The flow of TEGa was 7.8 $\mu$mole/min and the molar ratio of V/III precursors was 50. The differences between growth of GaN using dimethylhydrazine and growth of GaN using ammonia have been previously reported, Bourret-Courchesne et al., J. Cryst. Growth 217, 47 (2000). About 600 nm to 1000 nm of GaN was deposited at 1000° C. (first high temperature layer). The growth rate was 0.8 $\mu$m/hr. The temperature was then rapidly ramped down to an intermediate temperature (700 to 900° C.) for growth of the intermediate temperature-interlayer (IT-IL) and growth was allowed to proceed at this temperature for 15 minutes. The temperature was then rapidly ramped back up to 1000° C. to grow the top high temperature GaN layer. This growth process results in a structure: substrate/LT-buffer layer/HT-GaN layer/IT-IL GaN layer/HT-GaN layer. It is to be understood that the process and product defined herein is not limited to the above structure. The invention described herein only requires that an interlayer be formed using an intermediate temperature. Suprisingly, it was discovered through numberous investigations and studies that the formation of this intermediate temperature-interlayer, (IT-IL) results in a dramatic reduction of dislocations. Thus, far superior films are produced.

Non-limiting examples of the various structures achievable using the process described herein are as follows: The substrate is not restricted to c-plane sapphire. The substrate may be any material commonly used in GaN films and are readily available to those known in the art. Substrate is meant to include substrates of sapphire, SiC, [Si or Ga]As, and others suitable for Group III nitride growth. These are discussed in Mohammad et al., "Progress and Prospects of Group-III Nitride Semiconductors", Prog. Quant. Electr. 1996, Vol. 20, No. 5/6 pp. 415–419, hereby incorporated by reference in its entirety. The layer on top of the substrate is not restricted to GaN, but may also be an AlN film, or other Group III nitride film. This invention contemplates that the layer on top of the substrate be a low temperature buffer layer. There may be several layers on top of the substrate, prior to the the application of the intermediate temperature-interlayer (IT-IL). However, it is preferred that there be a low temperature GaN film deposited atop the c-plane sapphire substrate followed by the GaN interlayer, (IT-IL). On top of the low temperature buffer layer, it is contemplated that there be a high temperature GaN film. On top of the high temperature GaN film there is deposited the intermediate temperature-interlayer (IT-IL). This IT-IL may be an AlGaN film or GaN film. Preferably, the film is a GaN film. The invention described herein contemplates that a multitude of layer may be present on top of the IT-IL. Preferably there is a high temperature GaN film on top of the IT-IL. However, there may also be a multitude of GaN layers. There may also be protective or capping layers.

The invention described herein contemplates that an intermediate layer of GaN be applied using a temperature defined herein as "intermediate" thus forming an intermediate temperature-interlayer (IT-IL). The preferred temperature for forming this layer is approximately 800° C.

Low temperature as used herein refers to a temperature of less than approximately 600° C. Intermediate temperature as used herein refers to a temperature of greater than approximately 700° C. to approximately 900° C. High temperature as used herein refers to a temperature of greater than approximately 950° C. up to about 1200° C., preferably about 1000° C.

This invention contemplates that the GaN layers, (intermediate and high temperature) may be polycrystalline or amorphous. While the invention describes GaN layer it is contemplated that the process is suitable for other Group III nitride semiconductor films, such as yttrium, aluminum or indium. Deposition methods is meant to include any deposition technique available to one skilled in the art, including vapor deposition techniques, molecular beam epitaxy, chemical beam epitaxy, low-pressure chemical vapor deposition techniques, various epitaxial deposition techniques.

Examples of the thicknesses of the various layers of the preferred embodiment of the instant invention are as follows. The low temperature buffer layer next to the substrate is in the range of between 10 and 50 nm, preferably about 25 nm. The first high temperature GaN layer is deposited to a thickness of between 300 nm to several microns, preferably about 1–2 $\mu$m. The GaN IT-IL layer is deposited to a thickness of between 50 to 1000 nm thick, preferably about 100 nm. The second GaN high temperature layer deposited on top of the GaN IT-IL layer can be any thickness, but is preferably about 2 $\mu$m thick.

In one embodiment the instant invention contemplates a method of making a GaN film comprising: providing a substrate having a surface;

forming a buffer layer at a low temperature on top of the substrate;

forming a first GaN layer on top of the buffer layer at a high temperature;

forming a GaN interlayer (IT-IL) at an intermediate temperature on top of the first GaN layer.

In another embodiment there is contemplated a method of making a GaN film comprising;

providing a c-plane sapphire substrate having a surface;

forming a buffer layer at a low temperature;

forming a first GaN layer on the buffer layer using a low-pressure chemical vapor deposition process at a high temperature;

forming a GaN interlayer (IT-IL) on top of the first GaN layer using a low-pressure chemical vapor deposition process at an intermediate temperature which is lower than the high temperature used for the first GaN layer;

forming a second GaN layer on top of the GaN layer using a low-pressure chemical vapor deposition process at a high temperature.

Another embodiment of this invention is a GaN film comprising a substrate, a buffer layer formed on top of the substrate;

a first GaN layer formed on the buffer layer;

a GaN interlayer formed on the first GaN layer;

a second GaN layer formed on the GaN interlayer;

wherein the GaN film is characterized by having a dislocation density of less than or equal to about $4 \times 10^7/\text{cm}^2$.

Figure 2:
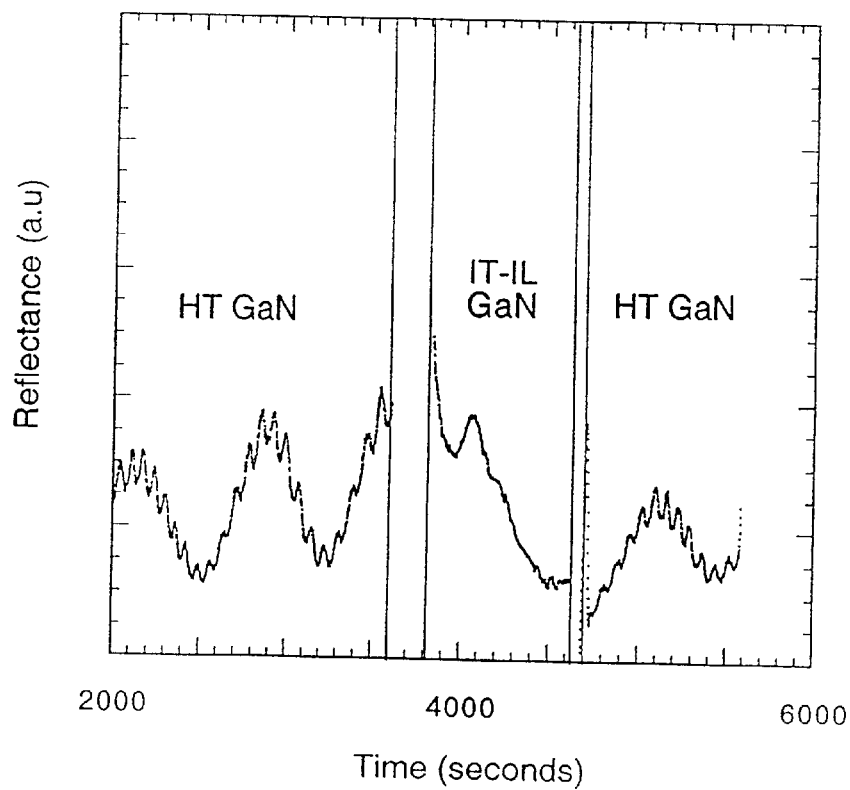
FIG. 2 is a laser interferogram recorded during the growth of the structure shown in FIG. 1.

Using laser reflectance it was determined the transition temperature at which the growth mode changes from a three-dimensional mode (3D) to a two dimensional mode (2D), see FIG. 2. FIG. 2 is a laser reflectance interferogram recorded during growth of a sample with the IT-IL grown at 800° C. The changes of temperature occurred between the vertical lines. The large oscillations are the growth oscillations while the small ones are due to parasitic interference with the reactor windows. After the drop of temperature to 800° C., the reflectance decreases indicating a roughening of the sample surface and three dimensional growth of the sample. Once the temperature is back up to 1000° C., the reflectance signal increases again indicating a rapid recovery of the two dimensional growth mode. A 3D growth mode results in the roughening of the surface which results in a decrease of the reflectance of the layer. A 2D growth mode smooths the surface and the reflectance increases to its maximum value that can be calculated theoretically. With our growth conditions 2D growth occurs above about 995° C. When the temperature is suddenly decreased to yield a 3D growth mode, with a low flow of reactants, a low density of small islands is nucleated on the growing surface. If the temperature is then increased rapidly and a 2D growth mode is reestablished, growth of the islands initially progresses mostly laterally. The dislocations propagate in the growth direction within the islands and bend over near the interface where the lateral growth takes place.

Figure 3:
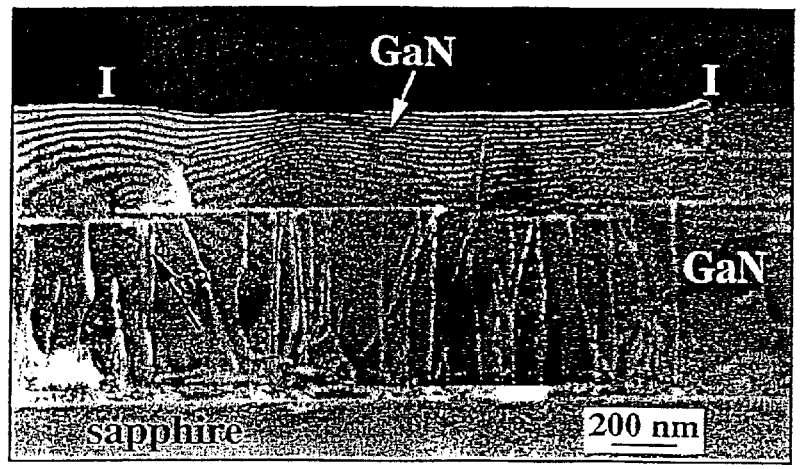
FIG. 3 is a cross section TEM image of a GaN film grown with an IT-IL layer.

A cross-section of TEM image of a GaN film grown with the IT-IL grown at 800° C. is shown in FIG. 3. This is a dark field image taken under two beam conditions with (1102) reflecting planes of the GaN/IL-GaN/GaN structure. The intermediate temperature GaN (IT-IL) layer appears as a separation line between the two high temperature layers in the image. Under these difraction conditions, most of the dislocations are visible in the image. The most striking feature of the FIG. 3 image is that it shows clearly that most of the threading dislocations in the first GaN layer do not propagate into the upper layer. The IT-IL layer reduces dislocation density by three orders of magnitude, from well above $10^{10}$ cm$^{-2}$ in the first HT-GaN to about $8 \times 10^7$ cm$^{-2}$ in the upper one. Moreover, we observe that the threading dislocations which propagate to the upper layer are closely spaced and they are grouped. They reach the surface of the top layer in specific areas shown in FIG. 3. The material in between two successive dislocation groups is defect free and this over large areas (over 1.5 $\mu$M in FIG. 3). These areas are of comparable size to those obtained by lateral epitaxial overgrowth, a more complicated process that involve ex-situ processing steps. Detailed TEM study shows that the mechanisms of dislocation reduction are similar to those described for the ELO process. However a notable difference is the absence of any coalescence boundaries indicative of the coherent nature of the 3D islands.

This invention contemplates that the intermediate-temperature GaN (IT-IL) layer appears between the two high-temperature layers. When GaN films are grown according to the process contemplated herein, most of the threading dislocations in the first high temperature GaN layer do not propagate into the upper GaN layer, as FIG. 3 demonstrates. The deposition of an IT-IL layer is a highly efficient process to avoid propagation of threading dislocations of any Burgers vector. In FIG. 3, the dislocation density is reduced by three orders of magnitude, from well above $10^{10}$ cm$^{-2}$ in the first HT-GaN to an average of $8 \times 10^7$ cm$^{-2}$ in the second one. For thicker sample, an average of less than $4 \times 10^7$ dislocations/cm$^2$ was found.

Figure 4:
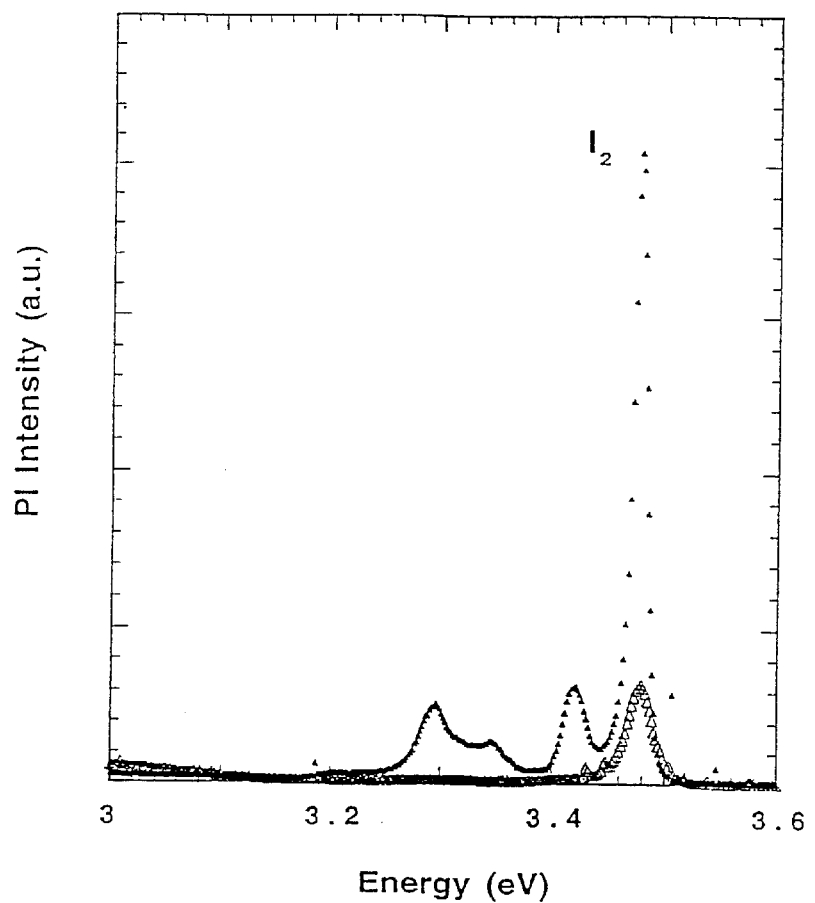
FIG. 4 is a photoluminescence spectra of a 600-nm thick GaN layer (open triangles) and of a same first layer overgrown with an IT-IL/high temperature layer about 70 nm thick (filled triangles).

FIG. 4 compares the photoluminescence spectrum of GaN layers grown with and without an IT-IL. The first GaN layer was grown at 1000° C. and was 600 nm thick. For the second GaN layer, the IT-IL was inserted on top of the 600 nm thick GaN and followed by growth of 70 nm of GaN grown at 1000° C. The intensity of the $I_2$ peak is remarkable increased for the layer containing the IT-IL. While not wishing to be bound by any particular theory or mechanism, the inventor believes that this may be due to the reduction in defect density and strain in the top layer due to the presence of the IT-IL.

The use of an intermediate temperature intermediate layer (IT-IL) instead of a low temperature layer, allows formation of isolated islands at the IL interface instead of forming a pseudo-amorphous continuous buffer layer. The islands appear to nucleate coherently as there are no coalescence front boundaries. Multiple IT-ILs will most likely further reduce the defect density and the absence of a continuous low temperature layer should reduce the overall strain and tendency for cracking. Immediate establishment of lateral overgrowth between the islands makes the interlayer efficient at bending over most of the threading dislocations. At 800° C., the precursors used in this study are fully decomposed and we can assume that the islands nucleated at this temperature are stoichiometric. This invention contemplates that an IT-IL would also be effective when ammonia and/or TMGa is used as a precursor as the inventor has not found major differences in the overall growth process using dimethylhydrazine vs. ammonia. A carrier gas may be $H_2$ or $N_2$ or a mixture of the two, or other carrier gasses known to one skilled in the art. Adjustments to temperature and flow rates would most likely be necessary to obtain the right morphology for the first high temperature layer; this is well within the ordinary skill in the art. The process presented here is independent of the substrate used. The invention contemplates that the IT-IL process will be useful as a nucleation scheme for homoepitaxy on GaN substrates grown by hydride vapor phase epitaxy that may still have a large number of dislocations. In terms of defect reduction, the GaN film contemplated herein is similar to those obtained with ELO however the IT-IL process does not require ex-situ processing steps and there is no defect accumulation at the coalescence front.

It will be appreciated by those skilled in the art that various modifications and extrapolations can be made in the process and article as described herein without departing from the spirit and scope of the invention.

I claim:

1. A method of making a GaN thin film comprising:

providing a substrate having a surface;

forming a buffer layer at a low temperature on top of the substrate;

forming a first GaN layer on top of the buffer layer at a high temperature;

forming a GaN interlayer (IT-IL) at an intermediate temperature on top of the first GaN layer, said GaN interlayer being deposited to a thickness of 50 to 1000 nm, and forming a second GaN layer on top of the GaN interlayer, such that the GaN thin film has a dislocation density of less than or equal to about $4\times10^7/cm^2$.

2. A method according to claim 1, wherein the GaN first layer is deposited to a thickness of approximately 1–2 $\mu$m and the GaN interlayer (IT-IL) is deposited to a thickness of approximately 100 nm.

3. A method according to claim 1, wherein the buffer layer comprises GaN.

4. A method according to claim 1, wherein the send GaN layer is deposited to a thickness of approximately 1–2 $\mu$m.

5. A method according to claim 1, wherein the first and second GaN layers are deposited using an epitaxial deposition technique at a temperature of greater than approximately 950° C.; and the GaN interlayer (IT-IL) is deposited using an epitaxial deposition technique at a temperature of between approximately 700° C. and 900° C.

6. A method according to claim 5, wherein the GaN interlayer (IT-IL) is deposited at a temperature of approximately 800° C.

7. A method according to claim 5, wherein the epitaxial deposition technique comprises metallorganic chemical vapor deposition, molecular beam epitaxy methods or chemical beam epitaxy.

8. A method according to claim 7, wherein the epitaxial deposition technique comprises metallorganic chemical vapor deposition.

9. A method of making a GaN film comprising;

providing a c-plane sapphire substrate having a surface;

forming a buffer layer at a low temperature;

forming a first GaN layer on the buffer layer using a low-pressure chemical vapor deposition process at a high temperature;

forming a GaN interlayer (IT-IL) on top of the first GaN layer using a low-pressure chemical vapor deposition process at an intermediate temperature which is lower than the high temperature used for the first GaN layer, said GaN interlayer being deposited to a thickness of 50 to 1000 nm;

forming a second GaN layer on top of the GaN layer using a low-pressure chemical vapor deposition process at a high temperature, such that the GaN thin film has a dislocation density of less than or equal to about $4\times10^7/cm^2$.

10. A method according to claim 9, wherein the buffer layer comprises GaN.

* * * * *